(12) United States Patent
Dornbusch (10) Patent No.: US 7,538,596 B2
(45) Date of Patent: May 26, 2009

(54) LOW DISTORTION QUADRATURE MIXER AND METHOD THEREFOR

(75) Inventor: Andrew W. Dornbusch, Austin, TX (US)

(73) Assignee: Silicon Laboratories, Inc., Austin, TX (US)

( * ) Notice: Subject to any disclaimer, the term of this patent is extended or adjusted under 35 U.S.C. 154(b) by 1123 days.

(21) Appl. No.: 10/853,473

(22) Filed: May 25, 2004

(65) Prior Publication Data

US 2005/0266821 A1 Dec. 1, 2005

(51) Int. Cl.
*G06F 7/44* (2006.01)

(52) U.S. Cl. ....................... 327/356; 327/359

(58) Field of Classification Search ............. None
See application file for complete search history.

(56) References Cited

U.S. PATENT DOCUMENTS

| | | | |
|---|---|---|---|
| 5,221,926 A | 6/1993 | Jackson | |
| 5,610,942 A | 3/1997 | Chen et al. | |
| 5,999,804 A | 12/1999 | Forgues | |
| 6,035,186 A | 3/2000 | Moore et al. | |
| 6,049,573 A | 4/2000 | Song | |
| 6,104,227 A | 8/2000 | Durec et al. | |
| 6,122,497 A | 9/2000 | Gilbert | |
| 6,236,847 B1 | 5/2001 | Stikvoort | |
| 6,269,127 B1 | 7/2001 | Richards | |
| 6,308,058 B1 | 10/2001 | Souetinov et al. | |
| 6,487,398 B1 | 11/2002 | Nobbe et al. | |
| 6,529,100 B1 | 3/2003 | Okanobu | |
| 6,583,675 B2 | 6/2003 | Gomez | |
| 6,826,393 B1 | 11/2004 | Komurasaki et al. | |
| 6,999,747 B2 | 2/2006 | Su | |
| 7,042,272 B2 | 5/2006 | Dornbusch | |
| 7,127,227 B2 | 10/2006 | Takahiko | |
| 7,130,604 B1 | 10/2006 | Wong et al. | |
| 7,184,737 B2 | 2/2007 | Liu | |
| 7,190,943 B2 | 3/2007 | Davis | |
| 7,251,298 B1 | 7/2007 | Hietala et al. | |
| 7,263,344 B2 * | 8/2007 | Manku | 455/323 |
| 2003/0071925 A1 | 4/2003 | Kanno et al. | |
| 2004/0041616 A1 * | 3/2004 | Khlat et al. | 327/355 |
| 2004/0052300 A1 | 3/2004 | Lopez-Estrada | |
| 2005/0175132 A1 | 8/2005 | Yang | |
| 2005/0220224 A1 | 10/2005 | Dornbusch | |

(Continued)

OTHER PUBLICATIONS

Wiegerink, Remco J., "Synthesis of MOS translinear circuits," The Kluwer International Series in Engineering and COmputer Science, vol. 246, pp. 78-85, Aug. 1993.

(Continued)

*Primary Examiner*—Cassandra Cox
(74) *Attorney, Agent, or Firm*—Larson Newman Abel & Polansky, LLP (57) ABSTRACT

A mixer (114) includes an input amplifier (620) and a barrel shifter (640). The input amplifier (620) has an input for receiving an input signal, and first through fourth output terminals respectively providing first through fourth current signals. The barrel shifter (640) has first through fourth input terminals for respectively receiving the first through fourth current signals, first through fourth control terminals for respectively receiving first through fourth clock signals, and first through fourth output terminals for respectively providing positive and negative in-phase output signals and positive and negative quadrature output signals.

28 Claims, 7 Drawing Sheets

U.S. PATENT DOCUMENTS

2005/0265480 A1    12/2005    Dornbusch
2006/0128341 A1    6/2006    Magnussen et al.

OTHER PUBLICATIONS

"SAW Components," EPCOS AG Data Sheet Y 7103 L, Surface Acoustic Wave Components Division OFW E UE, 6 pp., Jun. 14, 2000.

Terrovitis, M. T. and Meyer, R. G., "Noise and Intermodulation Distortion in Current-Commutating CMOS Mixers," Berkeley Wireless Research Center Retreat, 3 pp., Jun. 1999.

Karvonen, S. et al., "A Low Noise Quadrature Subsampling Mixer," Proceedings of IEEE International Symposium of Circuits and Systems (ISCAS2001), Darling Harbour, Sydney, Australia, IV-790-IV-793, Sep. 2001.

Lee, Kyeongho, et al, "A Single-Chip 2.4-GHz Direct-Conversion CMOS Receiver for Wireless Local Loop using Multiphase Reduced Frequency Conversion Technique," IEEE Journal of Solid-State Circuits, vol. 36, No. 5, pp. 800-809, May 2001.

Hornak, Thomas et al., "An Image-Rejecting Mixer and Vector Filter with 55-dB Image Rejection over Process, Temperature, and Transistor Mismatch," IEEE Journal of Solid-State Circuits, vol. 36, No. 1, pp. 23-33, Jan. 2001.

Hornak, Tom, "Using polyphase filters as image attenuators," RF Signal Processing, [online] www.rfdesign.com, pp. 26-34, Jun. 2001.

[[Actions on the Merits by the U.S.P.T.O. as of Sep. 19, 2007, 2 pages.]].

* cited by examiner

LOW DISTORTION QUADRATURE MIXER AND METHOD THEREFOR

CROSS REFERENCE TO RELATED APPLICATIONS

Related subject matter is contained in the following copending applications:
1. Application Ser. No. 10/814,615, filed on Mar. 31, 2004, entitled "Polyphase Filter with Passband Compensation and Method Therefor" invented by Andrew W. Dornbusch and assigned to the assignee hereof.
2. Application Ser. No. 10/853,633, filed of even date herewith, entitled "Transconductance Amplifier with Substantially Constant Resistance and Mixer Using Same" invented by Andrew W. Dornbusch and assigned to the assignee hereof.
3. Application Ser. No. 10/853,444, filed of even date herewith, entitled "Mixer with Clock Resynchronization and Method Therefor" invented by Andrew W. Dornbusch and assigned to the assignee hereof.

TECHNICAL FIELD

The present invention generally relates to frequency conversion circuits, and more particularly to mixers.

BACKGROUND

Radio frequency (RF) receivers are used in a wide variety of applications such as television, cellular telephones, pagers, global positioning system (GPS) receivers, cable modems, cordless phones, satellite radio receivers, and the like. One common type of RF receiver is the so-called superheterodyne receiver. A superheterodyne receiver mixes the desired data-carrying signal with the output of tunable oscillator to produce an output at a fixed intermediate frequency (IF). The fixed IF signal can then be conveniently filtered and converted back down to baseband for further processing. Thus a superheterodyne receiver requires one or more mixing steps.

A superheterodyne receiver is a receiver that mixes the desired data-carrying signal with the output of tunable oscillator to produce an output at a fixed intermediate frequency (IF). The fixed IF signal can then be conveniently filtered and converted back down to baseband for further processing. Superheterodyne receivers are useful in a wide variety of applications in which the desired channel can occur within a wide band of frequencies, such as AM and FM radio, satellite radio, etc.

To reduce the cost of a superheterodyne radio receiver, it is useful to combine as many circuit elements as possible into a single integrated circuit (IC) built using low-cost complementary metal-oxide-semiconductor (CMOS) manufacturing processes. However integration creates its own set of problems. For example a conventional CMOS mixer is formed by a local oscillator (LO) and a multiplier circuit. The multiplier circuit converts an input voltage conveying the signal to be mixed into a current signal. A portion of the multiplier known as a chopper circuit selectively diverts the current signal based on clock signals output by the LO. However the LO is usually laid out as a block on an adjacent part of the IC from the multiplier. The clock signals are then provided to the chopper switches using conductors such as metal lines.

However the chopping process distorts the output signal because the transistors cannot be perfectly matched. Furthermore the signals are usually mixed with both an in-phase LO signal and a quadrature LO signal to form an in-phase mixed signal and a quadrature mixed signal. The transistors in the in-phase mixer and the quadrature mixer will also typically not track each other so that when they are recombined at baseband the image component will not perfectly cancel out, resulting in distortion of the output signal. What is needed is a mixer that has lower distortion than such known mixers.

BRIEF SUMMARY

In one form a mixer includes an input amplifier and a barrel shifter. The input amplifier has an input for receiving an input signal, and first through fourth output terminals for respectively providing first through fourth current signals. The barrel shifter has first through fourth input terminals for respectively receiving the first through fourth current signals, first through fourth control terminals for respectively receiving first through fourth clock signals, and first through fourth output terminals for respectively providing positive and negative in-phase output signals and positive and negative quadrature output signals.

In another form, a mixer includes an input amplifier and a chopper circuit. The input amplifier receives an input signal and provides a plurality of input current signals in response thereto. The chopper circuit is coupled to the input amplifier, and receives a plurality of phases of a local oscillator signal for selectively switching the plurality of input current signals in response to the plurality of phases of the local oscillator signal to provide both an in-phase output current signal and a quadrature output current signal to corresponding ones of a plurality of nodes. The chopper circuit forms at least one of the in-phase output current signal and the quadrature output current signal by selectively switching all of the plurality of input current signals to a respective node.

In yet another form a method is provided for mixing a signal from a first frequency to a second frequency. An input signal is converted into first through fourth input current signals. First through fourth clock signals are generated in response to phases of a local oscillator signal. The first through fourth input current signals are selectively switched to first through fourth output terminals, respectively, in response to the first clock signal, to the second, third, fourth, and first output terminals, respectively, in response to the second clock signal, to the third, fourth, first, and second output terminals, respectively, in response to the third clock signal, and to the fourth, first, second, and third output terminals, respectively, in response to the fourth clock signal.

In still another form a second mixer is provided for use in a receiver comprising a first mixer, a first filter, a second mixer, and a second filter. The first mixer has an input for receiving an RF signal, and an output for providing an intermediate frequency (IF) signal. The first filter has an input for receiving the IF signal, and an output for providing a filtered IF signal. The second mixer has an input for receiving the filtered IF signal, and an output for providing a baseband signal. The second filter having an input for receiving the baseband signal, and an output for providing a filtered baseband signal. The second mixer includes an input amplifier and a chopper circuit. The input amplifier receives the filtered IF signal and provides a plurality of input current signals in response thereto. The chopper circuit is coupled to the input amplifier and receives a plurality of phases of a local oscillator signal for selectively switching the plurality of input current signals in response to a plurality of phases of a local oscillator signal to provide both an in-phase output current signal and a quadrature output current signal to corresponding ones of a plurality of nodes. The chopper circuit forms at least one of the in-phase output current signal and the quadrature output current signal by selectively switching all of the plurality of input current signals to a respective node.

In yet another form a mixer includes a local oscillator, an input amplifier, a barrel shifter, and a load circuit. The local oscillator has a plurality of output terminals for providing first through fourth phase clock signals. The input amplifier has a first input terminal for receiving a positive input signal of a differential signal pair, a second input terminal for receiving a negative input signal of the differential signal pair, and first through fourth output terminals for respectively providing positive and negative input current signals of first and second differential current signal pairs. The barrel shifter has first through fourth input terminals respectively coupled to the first through fourth output terminals of the input amplifier, first through fourth control input terminals coupled to the local oscillator for respectively receiving the first through fourth phase clock signals, and first through fourth output terminals for providing positive and negative in-phase output current signals and positive and negative quadrature output current signals. The load circuit is coupled to the first through fourth output terminals of the barrel shifter for providing positive and negative in-phase output voltages and positive and negative quadrature output voltages respectively in response to the positive and negative in-phase output current signals and the positive and negative quadrature output current signals.

BRIEF DESCRIPTION OF THE DRAWINGS

The present invention will hereinafter be described in conjunction with the following drawing figures, wherein like numerals denote like elements.

DETAILED DESCRIPTION

The following detailed description is merely exemplary in nature and is not intended to limit the invention or the application and uses of the invention. Furthermore, there is no intention to be bound by any expressed or implied theory presented in the preceding technical field, background, brief summary or the following detailed description.

Figure 1:
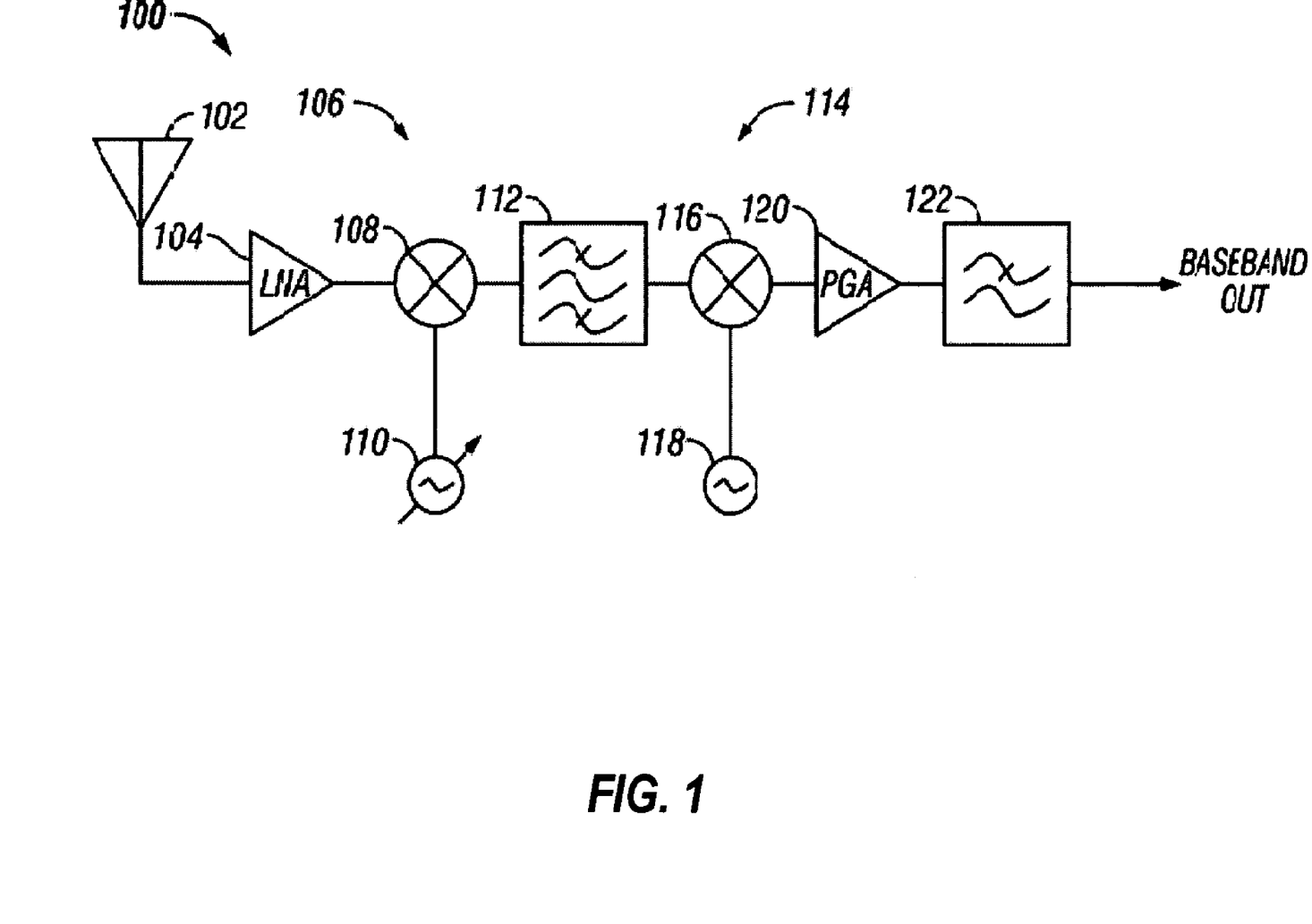
FIG. 1 illustrates in partial block diagram and partial schematic form a radio receiver according to the present invention.

FIG. 1 illustrates in partial block diagram and partial schematic form a radio receiver 100 according to the present invention. Receiver 100 is a dual-superheterodyne receiver that includes generally an antenna 102, a low noise amplifier labeled "LNA" 104, an RF to IF mixer 106, a bandpass filter 112, image rejecting mixer 114, a programmable gain amplifier labeled "PGA" 120, and a lowpass filter 122. Amplifier 104 has an input terminal connected to antenna 102, and an output terminal, and amplifies a broadband signal received on antenna 102 to provide an amplified signal to the output terminal thereof. Mixer 106 mixes the amplified signal to IF as follows. Mixer 106 includes a multiplier 108 and a tunable oscillator 110. Multiplier 108 has a first input terminal connected to the output terminal of amplifier 104, a second input terminal, and an output terminal. Tunable oscillator 110 has a tuning input terminal and an output terminal that provides an RF local oscillator (LO) signal. The RF LO signal is selected by the tuning input to have a frequency such that a desired channel is mixed from RF to a selected IF, which is also the center frequency of bandpass filter 112. Bandpass filter 112 has an input terminal connected to the output terminal of multiplier 108, and an output terminal for providing an output signal with significant signal energy in a passband centered around the chosen IF, and with significant attenuation of signal energy in a stopband outside the passband.

This signal at the output of bandpass filter 112 is then mixed to baseband in image rejecting mixer 114. Image rejecting mixer 114 includes a multiplier 116 and an oscillator 118. Multiplier 116 has a first input terminal connected to the output terminal of bandpass filter 112, a second input terminal, and an output terminal. Multiplier 114 further includes a polyphase filter for rejecting an image frequency, as will be described more fully below. Oscillator 118 provides an IF LO signal at an output terminal thereof. The IF LO signal is selected to have an output frequency chosen to mix the selected IF signal to baseband, and multiplier 116 thus provides the output signal thereof at baseband. Amplifier 120 is provided to amplify this signal to a desired level, and has an input terminal connected to the output terminal of multiplier 116, and an output terminal. Filter 122 has an input terminal connected to the output terminal of amplifier 120, and an output terminal for providing an output signal of receiver 100 labeled "BASEBAND OUT".

Receiver 100 is a dual-superheterodyne receiver with an image rejecting mixer. In order to attenuate a relatively large band of image frequencies, image rejecting mixer 114 preferably uses a polyphase filter, not shown in FIG. 1, such as the one described in copending application Ser. No. 10/814,615. The design of the oscillator 116 and multiplier 118 facilitates the image rejecting function of mixer 114 by producing differential in-phase and quadrature baseband signals with lower distortion due to improved phase clock accuracy and reduced susceptibility to gain mismatch. These features will be described more fully below but the polyphase filter will not.

Figure 2:
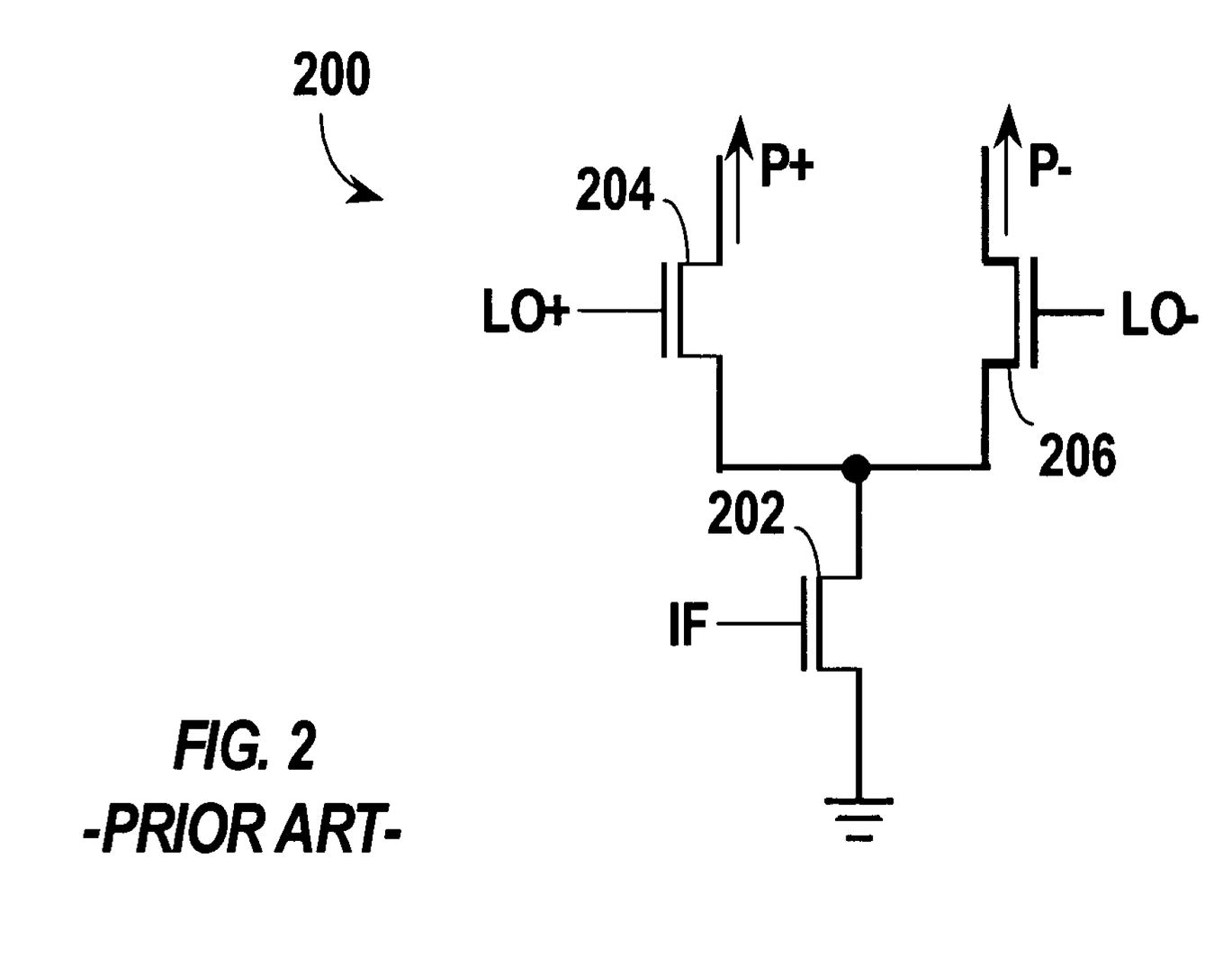
FIG. 2 illustrates in schematic form a portion of a mixer known in the prior art.

FIG. 2 illustrates in schematic form a portion 200 of a mixer known in the prior art. Mixer 200 includes three N-channel metal-oxide-semiconductor (MOS) transistors 202, 204, and 206. Note that a transistor having an insulated silicon gate is also conventionally considered to be an "MOS transistor" even though it does not have a metal gate. Transistor 202 has a drain, a gate for receiving an input signal labeled "IF", and a source connected to a ground potential, typically at zero volts. Transistor 204 has a drain for providing a positive output current signal labeled "P+", a gate for receiving a positive local oscillator signal labeled "LO+", and a source connected to the drain of transistor 202. Transistor 206 has a drain for providing a negative output current signal labeled "P−", a gate for receiving a positive local oscillator signal labeled "LO−", and a source connected to the drain of transistor 202. Portion 200 forms what is referred to as a single balanced mixer, in which the input signal (which may be an intermediate frequency signal) is mixed with a local oscillator signal to form a differential in-phase current signal. In a typical mixer this circuitry will be replicated to form a differential quadrature current signal using an LO signal in quadrature with the LO+ and LO− signal. The single-balanced mixer is susceptible to distortion caused by phase error mismatch between transistors 204 and 206, as well as between transistor 202 and the corresponding transistor in the corresponding quadrature portion of the mixer.

Figure 3:
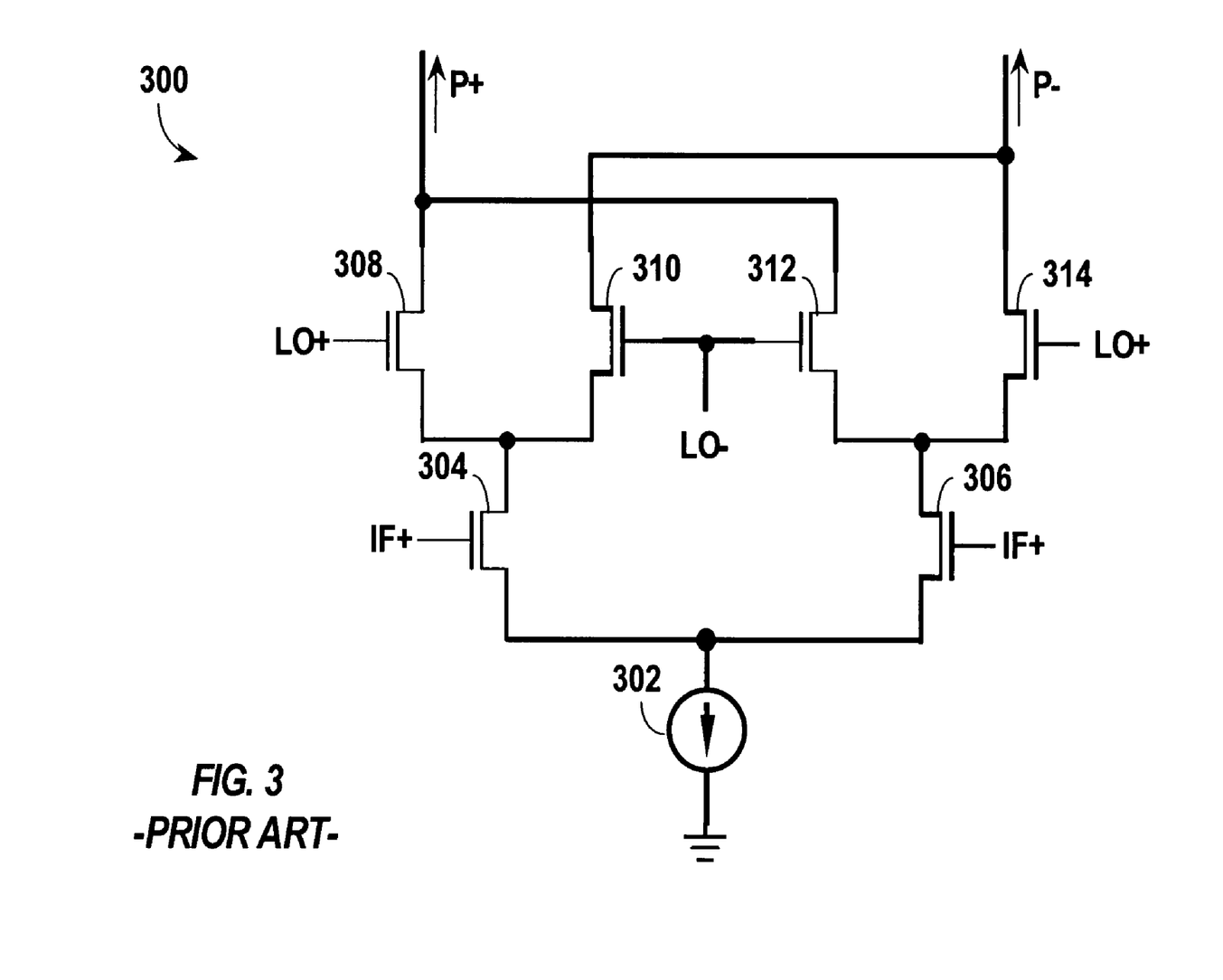
FIG. 3 illustrates in schematic form a portion of another mixer known in the prior art.

FIG. 3 illustrates in schematic form a portion 300 of another mixer known in the prior art. Portion 300 include a current source 302, and N-channel transistors 304, 306, 308, 310, 312, and 314. Current source 302 has a first terminal and a second terminal connected to ground. Transistor 304 has a drain, a gate for receiving IF+, and a source connected to the first terminal of current source 302. Transistor 306 has a drain, a gate for receiving IF−, and a source connected to the first terminal of current source 302. Transistor 308 has a drain for providing current signal P+, a gate for receiving signal LO+, and a source connected to the drain of transistor 304. Transistor 310 has a drain for providing current signal P−, a gate for receiving signal LO−, and a source connected to the drain of transistor 304. Transistor 312 has a drain connected to the drain of transistor 308, a gate for receiving signal LO−, and a source connected to the drain of transistor 306. Transistor 314 has a drain connected to the drain of transistor 310, a gate for receiving signal LO+, and a source connected to the drain of transistor 306.

Portion 300 forms what is referred to as a double balanced mixer or Gilbert cell, in which the differential input signal is mixed with a differential local oscillator signal to form a differential in-phase current signal. Like the single balanced case, this circuitry may be replicated to form a differential quadrature current signal using a quadrature local oscillator signal. Transistors 304 and 306 selectively divert the current of current source 302 based on the differential input signal. Transistors 308, 310, 312, and 314 form a "chopper" circuit that "chops" the two portions of the differential current using the differential LO signal. Since each output current signal of the differential current pair, namely P+ and P−, are formed by chopping using both LO signals, they are less susceptible to distortion from phase error between the positive and negative components of the LO clock signal. However they are still susceptible to distortion caused by phase error between the in-phase LO signal and the quadrature LO signal. They are also susceptible to mismatch between transistors 304 and 306, as well as mismatch between the current sources 302 of the in-phase and quadrature mixers.

Figure 4:
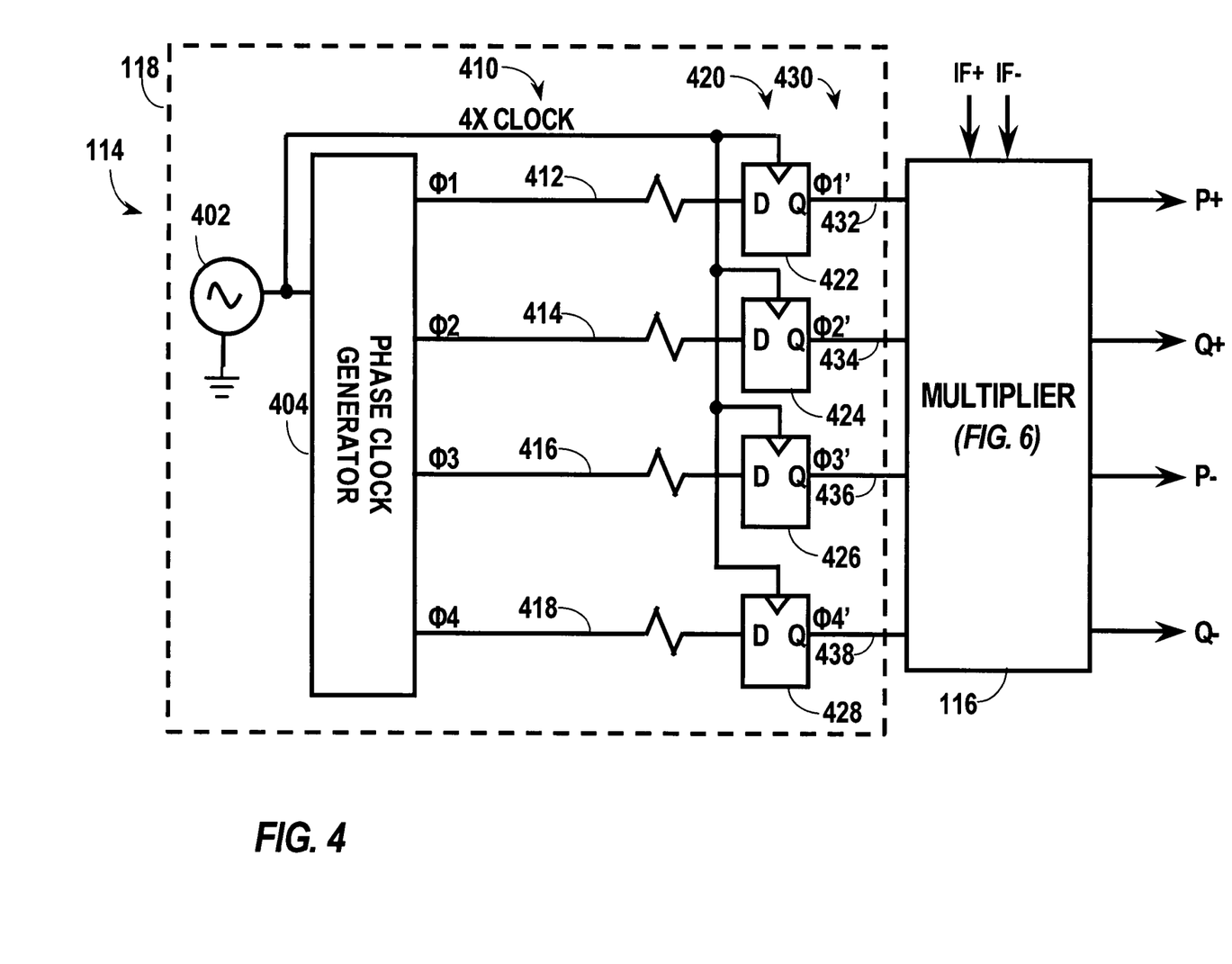
FIG. 4 illustrates in partial block diagram and partial schematic the mixer of FIG. 1.

FIG. 4 illustrates in partial block diagram and partial schematic mixer 114 of FIG. 1, including local oscillator 116 and multiplier 118. Local oscillator 116 includes generally an oscillator 402, a phase clock generator 404, a first set of conductors 410, a latch 420, and a second set of conductors 430. Oscillator 402 provides an output clock signal labeled "4× CLOCK" referenced to ground. Phase clock generator 404 has an input terminal for receiving the 4× CLOCK, and output terminals for providing four phase clock signals labeled "φ1", "φ2", "φ3", and "φ4". The phase clock signals are conducted on respective conductors 412, 414, 416, and 418, with phase clock generator 404 connected to a first end of the conductor and latch 420 connected to a second end.

Latch 420 includes D flip-flops 422, 424, 426, and 428. Flip-flop 422 has a D input terminal connected to the second end of conductor 412, a clock input terminal for receiving the 4× CLOCK, and a Q output terminal for providing a latched phase clock signal labeled "φ1'". Flip-flop 424 has a D input terminal connected to the second end of conductor 414, a clock input terminal for receiving the 4× CLOCK, and a Q output terminal for providing a latched phase clock signal labeled "φ2'". Flip-flop 426 has a D input terminal connected to the second end of conductor 416, a clock input terminal for receiving the 4× CLOCK, and a Q output terminal for providing a latched phase clock signal labeled "φ3'". Flip-flop 428 has a D input terminal connected to the second end of conductor 418, a clock input terminal for receiving the 4× CLOCK, and a Q output terminal for providing a latched phase clock signal labeled "φ4'". Conductors 430 include four conductors 432, 434, 436, and 438 each having a first end connected to the Q output terminals of latches 422, 424, 426, and 428, respectively, and a second end connected to corresponding input terminals of multiplier 118.

Multiplier 118 has four inputs connected to the second ends of conductors 432, 434, 436, and 438, a pair of signal input terminals for receiving IF+ and IF−, and four output terminals respectively providing baseband signals P+, Q+, P−, and Q−.

In order to improve phase clock accuracy, mixer 114 resynchronizes the phase clocks using the 4× CLOCK at a physical location on the integrated circuit near where the phase clocks are used, that is at multiplier 118. Latch 420 requires a relatively small amount of circuitry and it can be placed to reduce the length of conductors 430 as much as possible. The an important feature is that the impedance of conductors 430 is less than the impedance of corresponding conductors 410. Note that this characteristic will generally mean that the length of conductors 430 will be shorter than the length of conductors 410. Note however that other factors contribute to the impedance such as total conductor area, dielectric (usually silicon dioxide or silicon nitride) spacing, etc. so that length is not the only determinant of impedance.

However all other factors aside it is important to reduce the length of conductors 430 as much as possible. Thus for example each individual D flip-flop in latch 420 might be laid out as a repeated cell in close proximity to multiplier 118. The uniformity in repeating the flip-flop cell layout may cause the length of conductors 430 to be somewhat above the theoretical minimum distance but it would be desirable to reduce it as much as practical to achieve the objective of reducing distortion. Also the lengths of each one of conductors 430 need to be made as nearly equal as possible.

In sum mixer 114 improves phase clock accuracy by reducing critical signal routing length of conductors 430 (therefore reducing the opportunity for differing propagation lengths and mismatched loading), decreasing the loading at the output of latch 420, and allowing the flip flops in latch 420 to be laid out so as to match their characteristics as nearly as possible.

Figure 5:
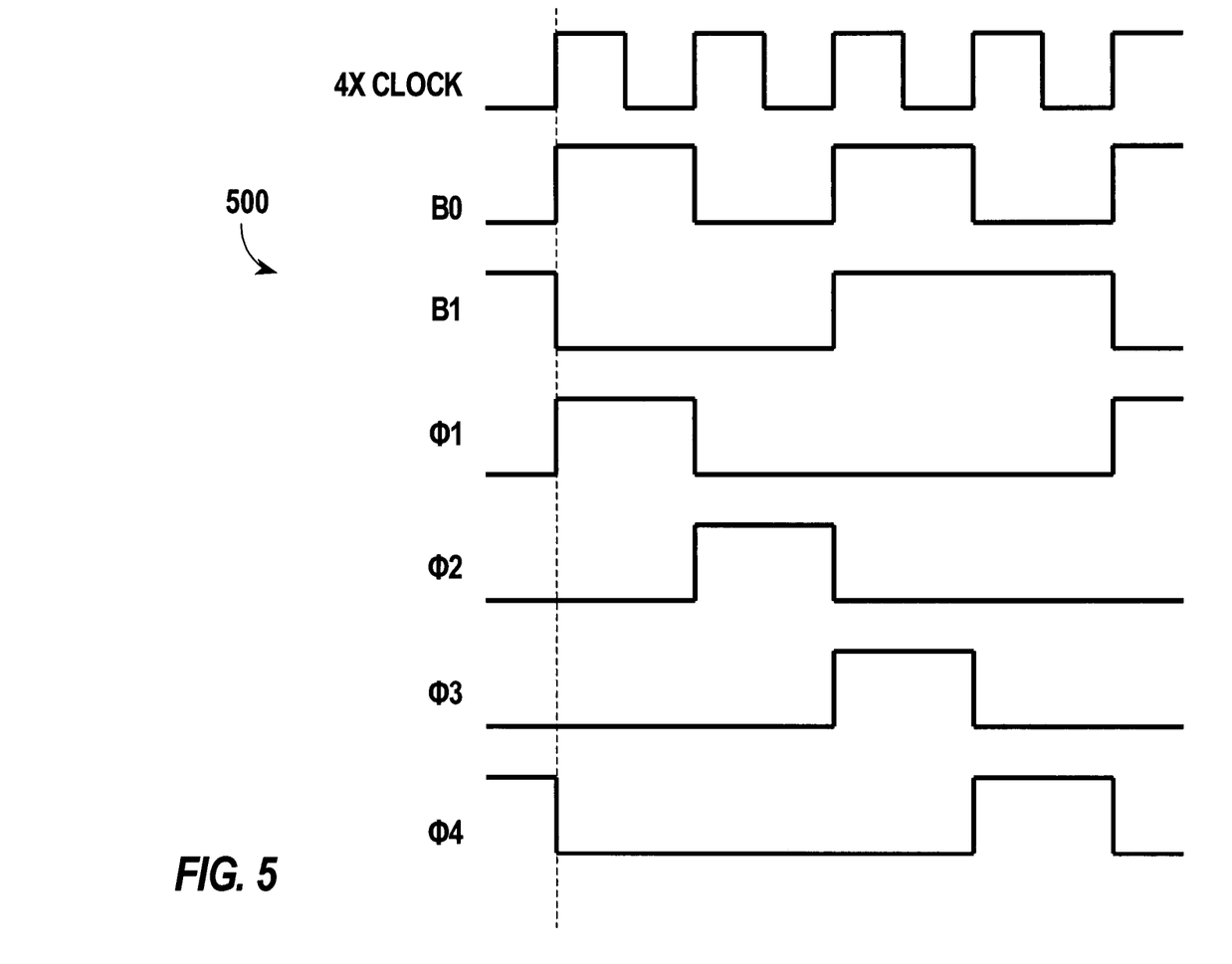
FIG. 5 illustrates a timing diagram for timing signals associated with the mixer of FIG. 4.

FIG. 5 illustrates a timing diagram 500 for timing signals associated with mixer 114 of FIG. 4. Timing diagram 500 illustrates the 4× CLOCK signal and the four phase clock signals φ1, φ2, φ3, and φ4. It also illustrates two signals labeled "B0" and "B1" that are used to generate the phase clock signals. B0 and B1 are the outputs of a binary counter (not shown in FIG. 4) that is part of phase clock generator 404 and that increments once for each cycle of the 4× CLOCK. Phase clock generator 404 generates the phase clock signals by performing logical operations on the counter outputs. Thus φ1 equals B0 and NOT B1; φ2 equals NOT B0 and NOT B1; φ3 equals B0 and B1; and φ4 equals NOT B0 and B1. Note that phase clock generator 404 may be implemented using other similar digital logic circuits.

Figure 6:
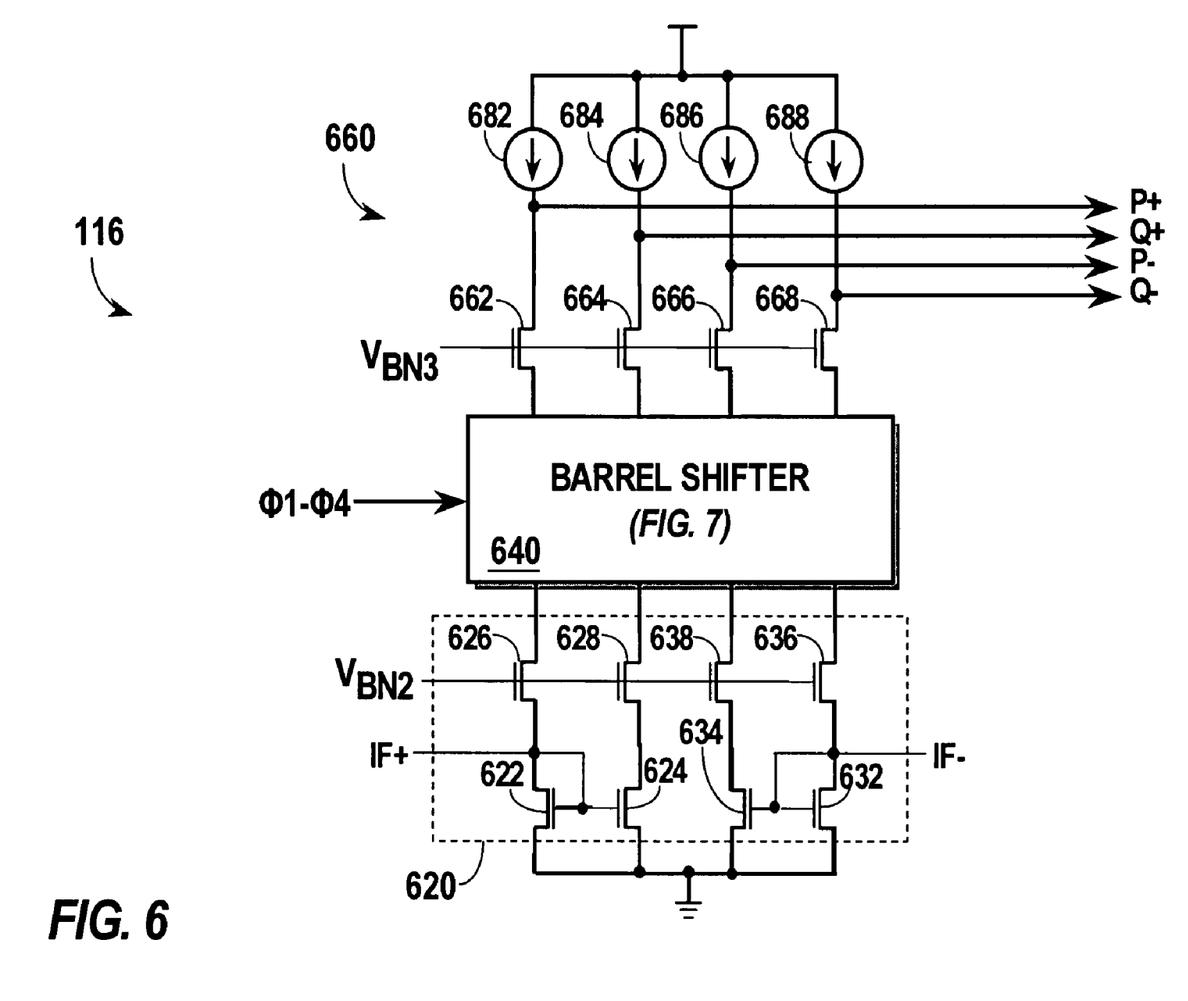
FIG. 6 illustrates in partial block diagram and partial schematic the multiplier of the mixer of FIG. 1.

FIG. 6 illustrates in partial block diagram and partial schematic multiplier 118 of mixer 114 of FIG. 1. Multiplier 118 includes generally a transconductance amplifier 620, a chopper circuit in the form of a barrel shifter 640, and a load circuit 660. Transconductance amplifier 620 includes N-channel MOS transistors 622, 624, 626, 628, 632, 634, 636, and 638. Transistor 622 has a drain and gate connected together and receiving signal IF+, and a source connected to ground. Transistor 624 has a drain, a gate connected to the drain and gate of transistor 622, and a source connected to ground. Transistor 626 has a drain for providing a negative current of a first differential input current pair, a gate for receiving a bias voltage labeled "VBN2", and a source connected to the drain of transistor 622. Transistor 628 has a drain for providing a positive current of the first differential input current pair, a gate for receiving bias voltage VBN2, and a source connected to the drain of transistor 624. Transistor 632 has a drain and gate connected together and receiving signal IF−, and a source connected to ground. Transistor 634 has a drain, a gate connected to the drain and gate of transistor 632, and a source connected to ground. Transistor 636 has a drain for providing a positive current of a second differential input current pair, a gate for receiving bias voltage VBN2, and a source connected to the drain of transistor 632. Transistor 638 has a drain for providing a negative current of the second differential input current pair, a gate for receiving bias voltage VBN2, and a source connected to the drain of transistor 634.

Barrel shifter 620 has four input terminals respectively receiving the positive and negative currents of the first and second differential input current pairs, four clock input terminals for receiving clock signals φ1-φ4, and four output terminals connected to respective nodes for providing positive and negative currents of each of the first and second differential output current pairs.

Load circuit 660 includes four N-channel MOS transistors 662, 664, 666, and 668, and four current sources 682, 684, 686, and 688. Transistor 662 has a drain for providing an output voltage labeled "P+", a gate for receiving a bias voltage labeled "VNB3", and a source connected to the first node for receiving the negative current of the first differential output current pair. Transistor 664 has a drain for providing an output voltage labeled "Q+", a gate for receiving bias voltage VNB3, and a source connected to the second node for receiving the positive current of the first differential output current pair. Transistor 666 has a drain for providing an output voltage labeled "P−", a gate for receiving bias voltage VNB3, and a source connected to the third node for receiving the positive current of the second differential output current pair. Transistor 668 has a drain for providing an output voltage labeled "Q−", a gate for receiving bias voltage VNB3, and a source connected to the fourth node for receiving the negative current of the second differential output current pair. Current source 682 has a first terminal connected to a positive power supply voltage terminal, and a second terminal connected to the drain of transistor 662. Current source 684 has a first terminal connected to the positive power supply voltage terminal, and a second terminal connected to the drain of transistor 664. Current source 686 has a first terminal connected to the positive power supply voltage terminal, and a second terminal connected to the drain of transistor 666. Current source 688 has a first terminal connected to the positive power supply voltage terminal, and a second terminal connected to the drain of transistor 668.

In operation, transconductance amplifier 620 provides a linear input impedance and a linear differential output current. The linear input impedance is formed using two stacked pairs of N-channel MOS transistors, 622/626 and 632/636, operating in saturation and strong inversion. Transistors 622 and 632 are diode connected and cascode transistors 626 and 636 are biased with a constant bias voltage VBN2. Each of two additional pairs of transistors 624/628 and 634/638 forms a current mirror with their respective diode-connected transistors. The differential currents formed thereby are linear with respect to the input voltage. The linear input impedance helps the receiver IC operate with an impedance-sensitive external SAW filter.

More specifically, it can be demonstrated that the differential output current is linear with respect to the input voltage and the impedance is fixed and can be controlled to match the desired output impedance of the SAW filter. If $I_{D622}$ represents the drain current of transistor 622, then its value is given by the expression:

$$I_{D622} = \beta_{622}(V_{IF+} - V_T)^2 \qquad [1]$$

where $V_{IF+}$ is the voltage of signal IF+, $V_T$ is the threshold of transistor 622, and $\beta_{622}$ is a constant based on the physical and process characteristics of transistor 622. Likewise if $I_{D626}$ represents the drain current of transistor 626, then its value is given by the expression:

$$I_{D626} = \beta_{626}[(V_{BN2} - V_{IF+}) - V_T]^2 \qquad [2]$$

Now if VBN2 and $V_{IN}$ are defined to be set as follows:

$$V_{BN2} = 2V_T + 2V_{ON} \qquad [3]$$

and $$V_{IF+} = V_T + V_{ON} + V_I \qquad [4]$$

where $V_{ON}$ is a constant and $V_I$ is the input signal relative to $(V_T + V_{ON})$, then $$I_{D622} = \beta_{622}(V_{ON} + V_I)^2 \qquad [5]$$

and $$I_{D626} = \beta_{626}(V_{ON} - V_I)^2 \qquad [6]$$

We know that transistors 622 and 626 are matched in size, so we can define $\beta = \beta_{622} = \beta_{626}$. If the input current $I_{IN}$ is defined as the current output from the SAW filter, then $$\begin{aligned} I_{IN} &= I_{D622} - I_{D626} \\ &= \beta(V_{ON}^2 + 2V_I V_{ON} + V_I^2) - \beta(V_{ON}^2 - 2V_I V_{ON} + V_I^2) \\ &= 4\beta V_I V_{ON} \end{aligned} \qquad [7]$$

which is linear with respect to input voltage. The input impedance $Z_{IN}$ is given by:

$$Z_{IN} = \frac{V_I}{I_{IN}} = \frac{1}{4\beta V_{ON}} \qquad [8]$$

which is constant and controllable. The first differential input current $I_{DIFF1}$ is given by $$I_{OUT} = I_{D628} - I_{D626} = I_{D626} - I_{D622} = -4\beta V_I V_{ON} \qquad [9]$$

since $I_{D628} = I_{D624} = I_{D622}$. It should be clear that the second differential input current $I_{DIFF2}$ is derived similarly and the other portion of transconductance amplifier 620 receiving signal IF− will have the same properties of constant input impedance and linear differential output current. Note that transistors 622, 624, 626 and 628 will all have the same sizes in order to generate symmetrical differential input currents. Likewise transistors 632, 634, 636, and 638 will all have the same sizes.

The linear differential output current allows the use of a special chopper circuit (barrel shifter 640) that has further advantageous properties. Barrel shifter 640 compensates for phase clock error by switching currents forming both in-phase and quadrature output signals using the same set of clock signals, substantially canceling the effect of this phase clock error.

Figure 7:
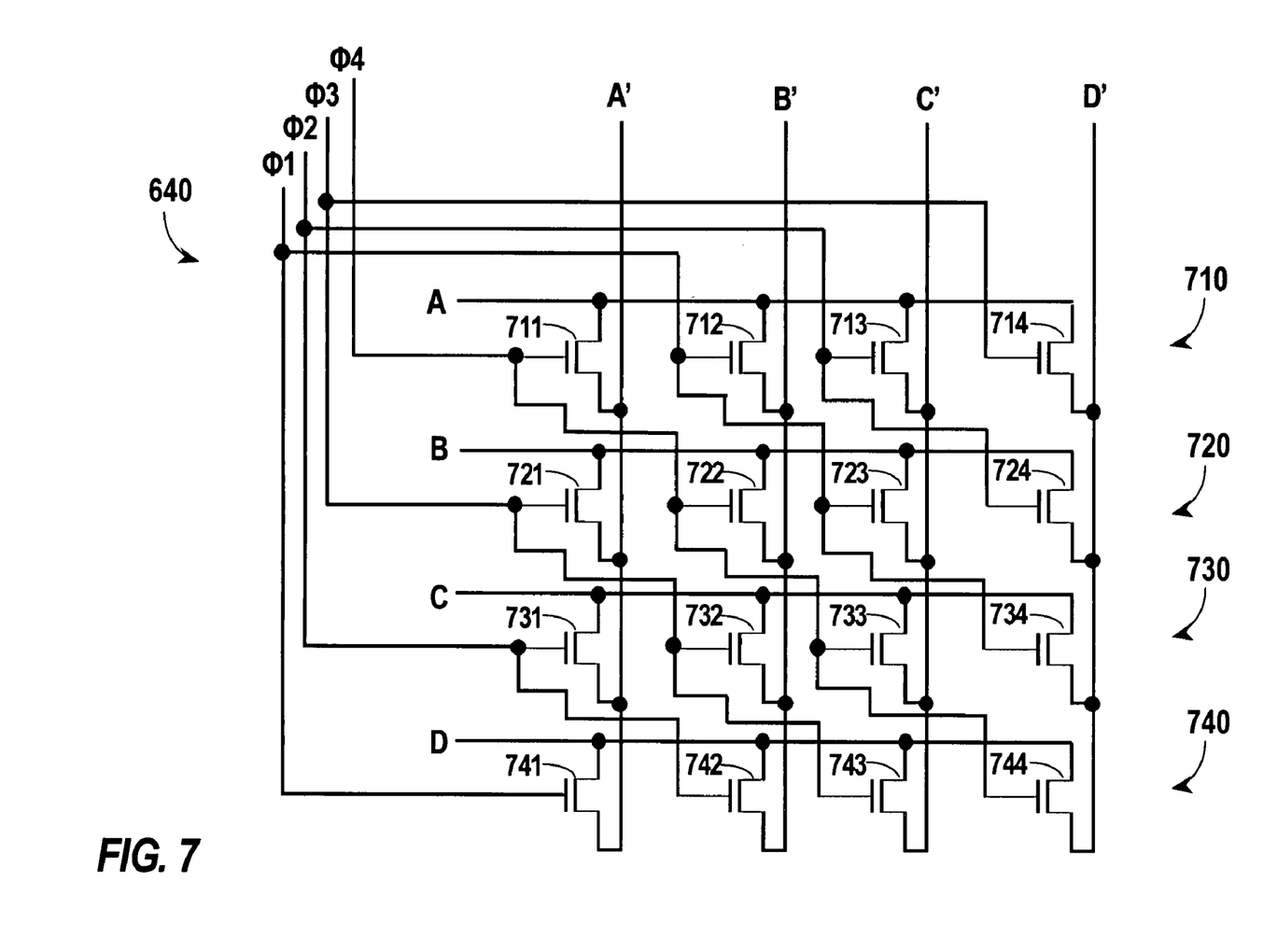
FIG. 7 illustrates in schematic form the barrel shifter of FIG. 6.

The operation of the barrel shifter is better understood with reference to FIG. 7, which illustrates in schematic form barrel shifter 640 of FIG. 6. Barrel shifter 640 includes four input nodes labeled "A", "B", "C", and "D" for receiving positive and negative input currents of first and second differential input current pairs, and four output nodes labeled "A'", "B'", "C'" and "D'" into which barrel shifter 640 provides positive and negative output currents of first and second differential output current pairs. Barrel shifter 640 includes generally four rows of transistors 710, 720, 730, and 740. Row 710 includes N-channel MOS transistors 711, 712, 713, and 714 each having a source connected to the A input node, gates for receiving respective ones of signals φ4, φ1, φ2, and φ3, and drains connected to respective ones of output nodes A', B', C', and D'. Row 720 includes N-channel MOS transistors 721, 722, 723, and 724 each having a source connected to the B input node, gates for receiving respective ones of signals φ3, φ4, φ1, and φ2, and drains connected to respective ones of output nodes A', B', C', and D'. Row 730 includes N-channel MOS transistors 731, 732, 733, and 734 each having a source connected to the C input node, gates for receiving respective ones of signals φ2, φ3, φ4, and φ1, and drains connected to respective ones of output nodes A', B', C', and D'. Row 740 includes N-channel MOS transistors 741, 742, 743, and 744 each having a source connected to the D input node, gates for receiving respective ones of signals φ1, φ2, φ3, and φ4, and drains connected to respective ones of output nodes A', B', C', and D'.

Barrel shifter 640 improves mixer gain matching over known chopper circuits by rotating the transistors used to chop each input current. Thus if one transistor caused gain mismatch relative to other transistors, it would be used to chop the input current only one-fourth of the time. Barrel shifter 640 also drives each output current using all four phase clock signals. Since such a phase clock error will distort both the positive and negative components of the differential in-phase or quadrature current pair in the same way, the effect will tend to be cancelled.

Returning now to FIG. 6, load circuit 660 converts the differential output current pairs at the output of barrel shifter 640 into corresponding differential voltage pairs. Cascode transistors 662, 664, 666, and 668 are biased by constant bias voltage VBN3 and reduce the voltage swing on cascode transistors 626, 628, 636, and 638, thereby improving linearity. Furthermore they also reduce the coupling of switching noise to the outputs.

Note that one of ordinary skill in the art will readily be able to construct an analogous P-channel MOS transconductance stage according to the principles described above. Also the various components of mixer 114 can be used together or in various combinations with known mixer circuits. Furthermore various polyphase filter designs are suitable for use in mixer 114. Mixer 114 uses the polyphase filter to pass the upper sideband and attenuate the lower sideband of the desired signal. However mixer 114 may be altered to pass the lower sideband and attenuate the upper sideband by simply reversing the sequence of clocks φ1-φ4, for example by swapping clocks φ1 and φ3 (or φ2 and φ4). Known mixers require that one of the LO clocks (in-phase or quadrature) be inverted to change the selected sideband.

While at least one exemplary embodiment has been presented in the foregoing detailed description, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing the exemplary embodiment or exemplary embodiments. It should be understood that various changes can be made in the function and arrangement of elements without departing from the scope of the invention as set forth in the appended claims and the legal equivalents thereof.

What is claimed is:

1. A mixer comprising:
   an input amplifier having an input for receiving an input signal, and first through fourth output terminals for respectively providing first through fourth current signals; and
   a barrel shifter having first through fourth input terminals for respectively receiving said first through fourth current signals, first through fourth control terminals for respectively receiving first through fourth clock signals, and first through fourth output terminals for respectively providing positive and negative in-phase output signals and positive and negative quadrature output signals.

2. The mixer of claim 1 wherein said input amplifier receives a differential input signal at said input.

3. The mixer of claim 1 further comprising:
   a load circuit coupled to said first through fourth output terminals of said barrel shifter for converting currents at said first through fourth output terminals into corresponding voltages.

4. The mixer of claim 3 wherein said load circuit comprises:
   a first cascode device having a first terminal coupled to said first output terminal of said barrel shifter, and a second terminal in series with a first current source for providing said positive in-phase signal;
   a second cascode device having a first terminal coupled to said second output terminal of said barrel shifter, and a second terminal in series with a second current source for providing said positive quadrature signal;
   a third cascode device having a first terminal coupled to said third output terminal of said barrel shifter, and a second terminal in series with a third current source for providing said negative in-phase signal; and
   a fourth cascode device having a first terminal coupled to said fourth output terminal of said barrel shifter, and a second terminal in series with a second current source for providing said negative quadrature signal.

5. The mixer of claim 4 wherein said first through fourth cascode devices comprise metal oxide semiconductor (MOS) transistors each having a gate for receiving a bias voltage.

6. The mixer of claim 1 wherein said first and second current signals of said input amplifier are characterized as forming a first differential current signal, and said third and fourth current signals of said input amplifier are characterized as forming a second differential current signal.

7. The mixer of claim 1 wherein said barrel shifter comprises a matrix of transistors for selectively coupling said first through fourth current signals to said first through fourth output terminals, respectively, in response to said first clock signal, to said second, third, fourth, and first output terminals, respectively, in response to said second clock signal, to said third, fourth, first, and second output terminals, respectively, in response to said third clock signal, and to said fourth, first, second, and third output terminals, respectively, in response to said fourth clock signal.

8. The mixer of claim 7 wherein said barrel shifter further comprises:
a first row of transistors each having a first current electrode coupled to said first input terminal, a control electrode for receiving a corresponding one of said first through fourth clock signals, and a second current electrode coupled to a respective one of said first through fourth output terminals;
a second row of transistors each having a first current electrode coupled to said second input terminal, a control electrode for receiving a corresponding one of said first through fourth clock signals, and a second current electrode coupled to a respective one of said first through fourth output terminals;
a third row of transistors each having a first current electrode coupled to said third input terminal, a control electrode for receiving a corresponding one of said first through fourth clock signals, and a second current electrode coupled to a respective one of said first through fourth output terminals; and
a fourth row of transistors each having a first current electrode coupled to said fourth input terminal, a control electrode for receiving a corresponding one of said first through fourth clock signals, and a second current electrode coupled to a respective one of said first through fourth output terminals.

9. A mixer comprising:
an input amplifier for receiving an input signal and providing a plurality of input current signals in response thereto; and
a chopper circuit coupled to said input amplifier and receiving a plurality of phases of a local oscillator signal for selectively switching said plurality of input current signals in response to said plurality of phases of said local oscillator signal to provide both an in-phase output current signal and a quadrature output current signal to corresponding ones of a plurality of nodes, wherein said chopper circuit forms at least one of said in-phase output current signal and said quadrature output current signal by selectively switching all of said plurality of input current signals to a respective node, wherein said chopper circuit provides said in-phase output current signal as a first differential current signal pair including a positive in-phase output current signal and a negative in-phase output current signal, and provides said quadrature output current signal as a second differential current signal pair including a positive quadrature output current signal and a negative quadrature output current signal.

10. The mixer of claim 9 further comprising:
a load circuit coupled to said chopper circuit for forming voltages on said plurality of nodes.

11. The mixer of claim 9 further comprising:
a local oscillator for generating said plurality of phases of said local oscillator signal.

12. The mixer of claim 9 wherein said input amplifier receives said input signal as a differential signal having positive and negative components thereof, and provides first and second differential current pairs in response thereto.

13. A method for mixing a signal from a first frequency to a second frequency comprising the steps of:
converting an input signal into first through fourth input current signals;
generating first through fourth clock signals in response to phases of a local oscillator signal; and
selectively switching said first through fourth input current signals respectively to first through fourth output terminals in response to said first clock signal, to said second, third, fourth, and first output terminals, respectively, in response to said second clock signal, to said third, fourth, first, and second output terminals, respectively, in response to said third clock signal, and to said fourth, first, second, and third output terminals, respectively, in response to said fourth clock signal.

14. The method of claim 13 further comprising the step of:
converting current signals on said first through fourth output terminals into corresponding voltage signals.

15. The method of claim 13 wherein said step of selectively switching comprises the step of selectively switching using a barrel shifter.

16. For use in a receiver comprising a first mixer having an input for receiving an RF signal, and an output for providing an intermediate frequency (IF) signal, a first filter having an input for receiving the IF signal, and an output for providing a filtered IF signal, a second mixer having an input for receiving the filtered IF signal, and an output for providing a baseband signal, and a second filter having an input for receiving the baseband signal, and an output for providing a filtered baseband signal, the second mixer comprising:
an input amplifier for receiving the filtered IF signal and providing a plurality of input current signals in response thereto; and
a chopper circuit coupled to said input amplifier and receiving a plurality of phases of a local oscillator signal for selectively switching said plurality of input current signals in response to a plurality of phases of a local oscillator signal to provide both an in-phase output current signal and a quadrature output current signal to corresponding ones of a plurality of nodes, wherein said chopper circuit forms at least one of said in-phase output current signal and said quadrature output current signal by selectively switching all of said plurality of input current signals to a respective node.

17. The receiver of claim 16 wherein the second mixer further comprises:
a load circuit coupled to said chopper circuit for forming voltages on said plurality of nodes.

18. The receiver of claim 17 wherein said load circuit comprises a plurality of cascode devices coupled to a corresponding one of said plurality of nodes, each in series with a corresponding one of a plurality of current sources.

19. The receiver of claim 17 wherein each of said plurality of cascode devices comprises a metal oxide semiconductor (MOS) transistor having a gate for receiving a bias voltage.

20. The receiver of claim 16 further comprising:
a local oscillator for generating said plurality of phases of said local oscillator signal.

21. The receiver of claim 16 wherein said input amplifier receives said filtered IF signal as a differential signal having positive and negative components thereof, and provides first and second differential current pairs in response thereto.

22. The receiver of claim 21 wherein said chopper circuit provides said in-phase output current signal as a first differential current signal pair including a positive in-phase output current signal and a negative in-phase output current signal, and provides said quadrature output current signal as a second differential current signal pair including a positive quadrature output current signal and a negative quadrature output current signal.

23. The receiver of claim 16 wherein said chopper circuit comprises a barrel shifter.

24. A mixer comprising
- a local oscillator having a plurality of output terminals for providing first through fourth phase clock signals;
- an input amplifier having a first input terminal for receiving a positive input signal of a differential signal pair, a second input terminal for receiving a negative input signal of said differential signal pair, and first through fourth output terminals for respectively providing positive and negative input current signals of first and second differential current signal pairs;
- a barrel shifter having first through fourth input terminals respectively coupled to said first through fourth output terminals of said input amplifier, first through fourth control input terminals coupled to said local oscillator for respectively receiving said first through fourth phase clock signals, and first through fourth output terminals for providing positive and negative in-phase output current signals and positive and negative quadrature output current signals; and
- a load circuit coupled to said first through fourth output terminals of said barrel shifter for providing positive and negative in-phase output voltages and positive and negative quadrature output voltages respectively in response to said positive and negative in-phase output current signals and said positive and negative quadrature output current signals.

25. The mixer of claim 24 wherein said load circuit comprises:
- a first cascode device having a first terminal coupled to said first output terminal of said barrel shifter, and a second terminal in series with a first current source for providing said positive in-phase output current signal;
- a second cascode device having a first terminal coupled to said second output terminal of said barrel shifter, and a second terminal in series with a second current source for providing said positive quadrature output current signal;
- a third cascode device having a first terminal coupled to said third output terminal of said barrel shifter, and a second terminal in series with a third current source for providing said negative in-phase output current signal; and
- a fourth cascode device having a first terminal coupled to said fourth output terminal of said barrel shifter, and a second terminal in series with a second current source for providing said negative quadrature output current signal.

26. The mixer of claim 24 wherein said first through fourth cascode devices comprise metal oxide semiconductor (MOS) transistors each having a gate for receiving a bias voltage.

27. The mixer of claim 24 wherein said barrel shifter comprises a matrix of transistors for selectively coupling said positive and negative input current signals of said first and second differential current signal pairs to said first through fourth output terminals, respectively, in response to said first clock signal, to said second, third, fourth, and first output terminals, respectively, in response to said second clock signal, to said third, fourth, first, and second output terminals, respectively, in response to said third clock signal, and to said fourth, first, second, and third output terminals, respectively, in response to said fourth clock signal.

28. The mixer of claim 27 wherein said barrel shifter further comprises:
- a first row of transistors each having a first current electrode coupled to said first input terminal, a control electrode for receiving a corresponding one of said first through fourth clock signals, and a second current electrode coupled to a respective one of said first through fourth output terminals;
- a second row of transistors each having a first current electrode coupled to said second input terminal, a control electrode for receiving a corresponding one of said first through fourth clock signals, and a second current electrode coupled to a respective one of said first through fourth output terminals;
- a third row of transistors each having a first current electrode coupled to said third input terminal, a control electrode for receiving a corresponding one of said first through fourth clock signals, and a second current electrode coupled to a respective one of said first through fourth output terminals; and
- a fourth row of transistors each having a first current electrode coupled to said fourth input terminal, a control electrode for receiving a corresponding one of said first through fourth clock signals, and a second current electrode coupled to a respective one of said first through fourth output terminals.

* * * * *